(12) United States Patent
Kim et al.

(10) Patent No.: US 9,934,849 B2
(45) Date of Patent: Apr. 3, 2018

(54) ASYMMETRICALLY SELECTING MEMORY ELEMENTS

(71) Applicant: Hewlett Packard Enterprise Development LP, Houston, TX (US)

(72) Inventors: Kyung Min Kim, Palo Alto, CA (US); Jianhua Yang, Palo Alto, CA (US); Zhiyong Li, Foster City, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/320,779

(22) PCT Filed: Jul. 25, 2014

(86) PCT No.: PCT/US2014/048306
§ 371 (c)(1),
(2) Date: Dec. 21, 2016

(87) PCT Pub. No.: WO2016/014089
PCT Pub. Date: Jan. 28, 2016

(65) Prior Publication Data
US 2017/0200493 A1      Jul. 13, 2017

(51) Int. Cl.
*G11C 11/00*      (2006.01)
*G11C 13/00*      (2006.01)

(52) U.S. Cl.
CPC .................. *G11C 13/003* (2013.01)

(58) Field of Classification Search
CPC ........... H01L 27/1446; H01L 27/14609; H01L 27/14643; H01L 27/14667;
(Continued)

(56) References Cited

U.S. PATENT DOCUMENTS

| 7,192,787 B2 | 3/2007 | DeBrosse et al. |
| 2008/0113464 A1 | 5/2008 | Savransky |

(Continued)

FOREIGN PATENT DOCUMENTS

| WO | WO-2013046217 A2 | 4/2013 |
| WO | WO-2014004130 A1 | 1/2014 |

OTHER PUBLICATIONS

International Searching Authority, The International Search Report and the Written Opinion, PCT/US2014/048306, dated Feb. 26, 2015, 12 Pgs.

(Continued)

Primary Examiner — Thong Q Le
(74) *Attorney, Agent, or Firm* — Mannava & Kang, P.C.

(57) ABSTRACT

A system for asymmetrically selecting a memory element is described. The system includes a number of memory cells in a crossbar array. Each memory cell includes a memory element to store information. The memory element is defined as an intersection between a column electrode and a row electrode of the crossbar array. Each memory cell also includes a selector to select a target memory element by relaying a first selecting voltage to a column electrode that corresponds to the target memory element and relaying a second selecting voltage to a row electrode that corresponds to the target memory element. The system also includes a controller to pass a first standing voltage to column electrodes of the crossbar array and to pass a second standing voltage to row electrodes of the crossbar array. The first standing voltage is different than the second standing voltage.

15 Claims, 4 Drawing Sheets

(58) Field of Classification Search
CPC ......... H01L 27/14676; H01L 27/14687; H01L 27/28; H01L 27/285; H01L 27/30; H01L 27/307; H01L 27/308
USPC .. 257/E27.129, E27.132, E27.133, E27.142, 257/E27.146, 40, 5, 2, 291, 4, 414, 444, 257/49, 79; 438/22, 48, 49, 50, 57, 900; 355/151, 148, 215
See application file for complete search history.

(56) References Cited

U.S. PATENT DOCUMENTS

| | | |
|---|---|---|
| 2011/0286259 A1 | 11/2011 | Perner |
| 2011/0310656 A1 | 12/2011 | Kreupl et al. |
| 2012/0307542 A1 | 12/2012 | Siau et al. |
| 2013/0010521 A1 | 1/2013 | Carter |
| 2013/0028004 A1 | 1/2013 | Snider |
| 2016/0014598 A1* | 1/2016 | Westhues ............ H04W 12/04 380/259 |

OTHER PUBLICATIONS

Jung, C-M et al., Two-Step Write Scheme for Reducing Sneak-Path Leakage in Complementary Memristor Array, May 2012, IEEE, <http://ieeexplore.ieee.org/xpl/login.jsp?reload=true&tp=&arnumber=6153382&url=http%3A%2F%2Fieeexplore.ieee.org%2Fxpls%2Fabs_all.jsp%Farnumber%3D6153382>, pp. 611-218.

Wouters, D., Resistive Switching Materials and Devices for Future Memory Applications, Dec. 5, 2012, 43rd IEEE Semiconductor Interface Specialist Conference, Tutorial SISC San Diego, <http://www.ieeesisc.org/tutorials/2012_SISC_Tutorial.pdf>, 160 pages.

* cited by examiner

ASYMMETRICALLY SELECTING MEMORY ELEMENTS

BACKGROUND

Memory arrays are used to store data. A memory array may be made up of a number of memory elements. Data may be stored to memory elements by setting values of the memory elements within the memory arrays. For example, the memory bits may he set to 0, 1, or combinations thereof to store data in a memory bit of a memory array.

BRIEF DESCRIPTION OF THE DRAWINGS

The accompanying drawings illustrate various examples of the principles described herein and are a part of the specification. The illustrated examples do not limit the scope of the claims.

Throughout the drawings, identical reference numbers designate similar, but not necessarily identical, elements.

DETAILED DESCRIPTION

Figure 1:
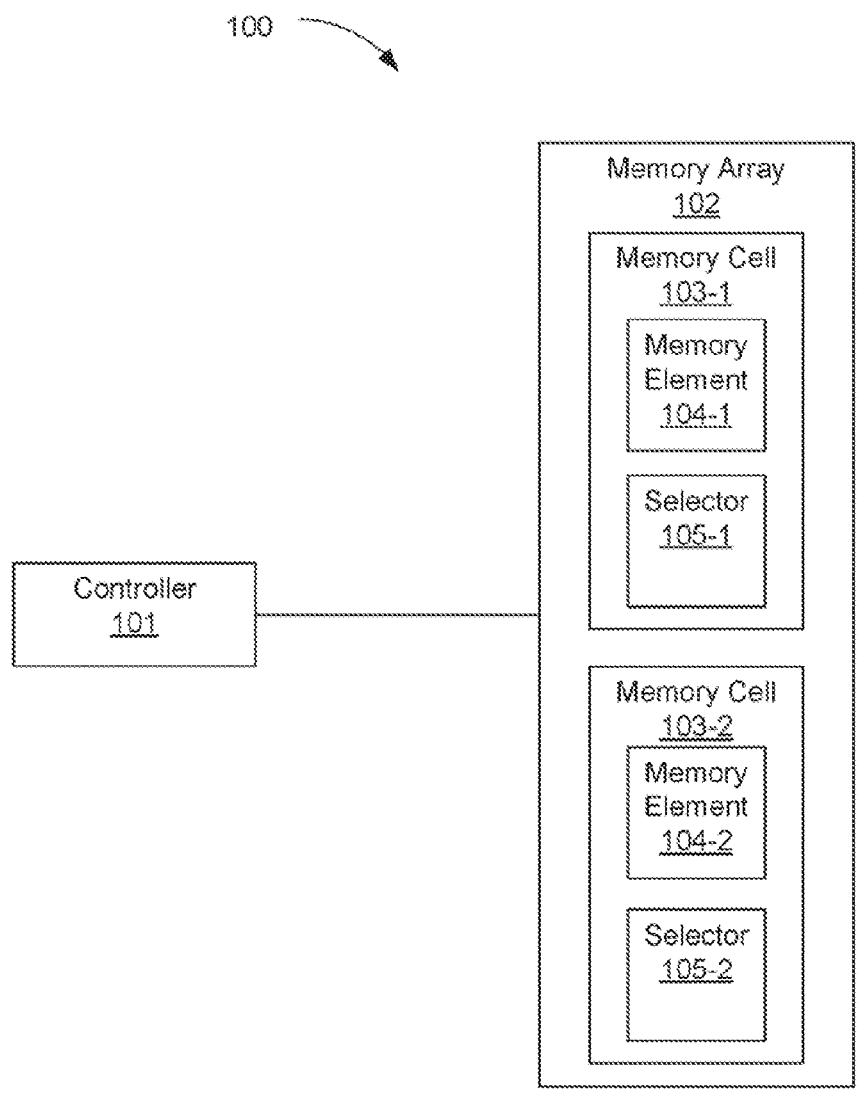
FIG. 1 is a diagram of a system for asymmetrically selecting a memory element according to one example of the principles described herein.

As described above, memory arrays may be used to store data by setting memory bit values within the memory array. More specifically, a memristor array including a number of memristors may be used to store data by setting memristor resistance values within the memristor array. In using a memristor as an element in a memory circuit, a digital operation is emulated by applying voltage pulses of different polarities to place the memristor in a "low resistance state" which resistance state is associated with a logical value, such as "1." Similarly, a voltage pulse of a different polarity, or different value, may place the memristor in a "high resistance state," which resistance state is associated with another logical value, such as "0." Each memristor has a switching voltage which refers to a voltage drop across a memristor which effectuates a change in state of the memristor. For example, a switching voltage of a memristor may be between 1-2 volts (V). In this example, an applied voltage greater than the switching voltage (i.e., the 1-2V) causes the memristor to change between a low resistance state and a high resistance state.

Memristors may be valued due their non-volatility, or their ability to retain information in the face of power loss such as during power failure, reboot, maintenance etc. In some examples, memristors may he placed in a crossbar array. In a crossbar array a first number of electrodes and a second number of electrodes may be oriented to form a grid. As used in the present specification the first number of electrodes may be referred to as column electrodes and the second number of electrodes may be referred to as row electrodes. Each intersection of one of the first number of electrodes with one of the second number of electrodes defines memristor elements of the memristor array.

A memristor may be selected to be written to or read from, by effectuating a voltage drop that is greater than a switching voltage of the memristor. The voltage drop may be effectuated by applying a first voltage of one polarity to a column electrode that corresponds to a target memristor and applying a second voltage of a second polarity to a row electrode that corresponds to the target memristor. The overall difference between the first voltage and the second voltage being greater than the switching voltage of the memristor.

A crossbar array may be beneficial as it provides a large amount of data storage on a relatively small footprint of a device. However, while crossbar memristor arrays may be beneficial, some characteristics of their use may reduce their implementation.

For example, as described above to select a target memristor, a first selecting voltage may be applied to a column electrode that corresponds to the target memristor. This may effectuate a voltage drop along other memristors that share the same column electrode. Similarly, applying a second selecting voltage to a row electrode that corresponds to the target memristor would effectuate a voltage drop in other memristors that share the same row electrode. Accordingly, a number of other memristors may be partially-selected. These partially-selected memristors may give rise to sneak current in the memristor array. Large sneak currents may lead to a number of issues such as saturating the current of driving transistors and increasing power consumption. Moreover, large sneak currents may introduce large amounts of noise which may lead to inaccurate or ineffective memory reading and writing operations.

Accordingly, the system and method described herein may alleviate these and other complications. More specifically, the present systems and methods generate a memristor array that reduces the sneak current by implementing asymmetric selecting voltages and asymmetric standing voltages across the memory array.

More specifically, the present disclosure describes a system for asymmetrically selecting a memory element. The system includes a number of memory cells in a crossbar array. Each memory cell includes a memory element to store information, the memory element being defined as an intersection between a row electrode and a column electrode of the crossbar array. Each memory cell also includes a selector to select a target memory element by relaying a first selecting voltage to a column electrode that corresponds to the target memory element and relaying a second selecting voltage to a row electrode that corresponds to the target memory element. The system also includes a controller to pass a first standing voltage to column electrodes of the crossbar array and a second standing voltage to row electrodes of the crossbar array. The first standing voltage is different than the second standing voltage.

The present disclosure describes a method for asymmetrically selecting a memory cell with a controller. The method includes applying a first standing voltage to column electrodes of a crossbar array and applying a second standing voltage to row electrodes of the crossbar array. The second standing voltage is different than the first standing voltage. The method also includes selecting a target memory element in the crossbar array by relaying a first selecting voltage to a column electrode corresponding to the target memory element and relaying a second selecting voltage to a row electrode corresponding to the target memory element.

The present disclosure describes a system for asymmetrically selecting a memory element. The system includes a number of memristor cells in a crossbar array. Each memristor cell includes a memristor to store information, a controller to apply a first standing voltage, xV, to a number of column electrodes of the crossbar array and to apply a second standing voltage yV to a number of row electrodes of the crossbar array. The system also includes a selector to select a target memristor by relaying a number of selecting voltages to a column electrode and row electrode that correspond to the target memristor such that the difference between the selecting voltages is at least equal to the switching voltage, V, of the memristor.

The systems and methods described herein may be beneficial by reducing the overall sneak current in the memristor array. For example, with large sneak path currents, operating a crossbar array is inefficient, if possible. Doing so may also increase the reliability of read and write operations, reduce power consumption, and alleviate other undesirable effects of sneak current in a memristor array.

As used in the present specification and in the appended claims, the term "memristor" may refer to a passive two-terminal circuit element that changes its electrical resistance under sufficient electrical bias. A memristor may have a switching voltage in which a voltage drop that is greater than the switching voltage causes the memristor to switch states. A partially-selected memristor may refer to a memristor that has a voltage drop that is less than the switching voltage. A partially-selected memristor may receive either the first selecting voltage passed through a selecting column electrode or the second selective voltage passed through the selecting row electrode. An unselected memristor may refer to a memristor that has a voltage drop that is less than a selecting voltage.

Further, as used in the present specification and in the appended claims, the terms "row electrodes" and "column electrodes" may refer to distinct electrode elements, such as wires, that are formed in a grid. The intersection of a row electrode and a column electrode form a memory element.

Further, as used in the present specification and in the appended claims, the term "target memristor element" or similar terminology may refer to a memory element that is to be written to or read from. A target memristor element may refer to a memristor element with a closed circuit selector as opposed to an open circuit selector.

Further, as used in the present specification and in the appended claims, the term "nonlinearity" may refer to a ratio of current at a first voltage level to the current at a second voltage level, in which the second voltage level is half the magnitude of the first voltage level in either the same or different polarity.

Still further, as used in the present specification and in the appended claims, the term "asymmetric" may refer to a selector or a memristor with unequal negative and positive switching voltages or currents. For example, an asymmetric memristor may have a first switching voltage with regards to a switch from a high resistance state to a low resistance state and a second and different, switching voltage with regards to a switch from a low resistance state to a high resistance state. By comparison, an asymmetric selector may have a first current for a positive voltage polarity and may have a different current for a negative voltage polarity of the same magnitude as the positive voltage polarity. The degree of asymmetry may be indicated by the nonlinearity of the memristor or selector.

Still further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

FIG. 1 is a diagram of a system (100) for asymmetrically selecting a memory element (104) according to one example of the principles described herein. The system (100) may include a memory array (102). A memory array (102) may be used to store any type of information. Accordingly, a memory array (102) may be made up of individual memory cells (103) to store information. While FIG. 1 depicts two memory cells (103-1, 103-2), a memory array (102) may include any number of memory cells (103). The memory array (102) may be a crossbar array. In a crossbar array, a number of column electrodes, such as wires, may be oriented in a first direction and a number of row electrodes, such as wires, may be oriented in a second direction that is perpendicular to the column electrodes. In this example, each intersection of each row electrode with a column electrode defines a node that is a memory element (104). In some examples, the memory elements (104-1,104-2) may be memristors that retain data in the face of a power loss. In this example, a row electrode or a column electrode may form a bottom electrode of the memristor and the other electrode (i.e., row or column) may form a top electrode of the memristor. More detail concerning the structure of a crossbar array is given below in connection with FIG. 3.

The memristors store information by indicating a logical value to a controller (101). The memristors may indicate this logical value based on their resistance. For example, a memristor in a low resistance state may indicate a logical value of 1. By comparison, a memristor in a high resistance state may indicate a logical value of 0. The number of memristors in a memristor array (102) form a sequence of 1s and 0s that indicate stored information. The resistance state, and the corresponding logical value, are selected by a voltage pulse sent from the controller (101) to the memristor array (102).

A memory cell (103-1, 103-2) may also include a selector (105-1,105-2) that selects a target memory element (104). For example, a selector (105) may be a diode that either allows a selecting voltage to pass to a memristor or that prevents a selecting voltage from passing to the memristor.

The system (100) may also include a controller (101) to manage the memory array (102). For example, the controller (101) may pass a number of standing voltages to the memory array (102). The standing voltages may be voltages that are passed to multiple memory elements (104) in a memory array (103) and that facilitate selection of a target memory element (104).

The controller (101) may include a number of modules to carry out the functionality of asymmetrically selecting a memory cell (103). The modules refer to a combination of hardware and program instructions to cause the controller (101) to implement at least the functionality of asymmetrically selecting a memory cell (103). The controller may include memory resources that store the program instructions. The program instructions may include a readable storage medium that contains program code to causes tasks to be executed by a processor, such as the controller (101). The readable storage medium may be tangible and/or physical storage medium. The readable storage medium may be any appropriate storage medium that is not a transmission storage medium. A non-exhaustive list of readable storage medium types includes non-volatile memory, volatile memory, random access memory, write only memory, flash memory, electrically erasable program read only memory, or types of memory, or combinations thereof.

Figure 2:
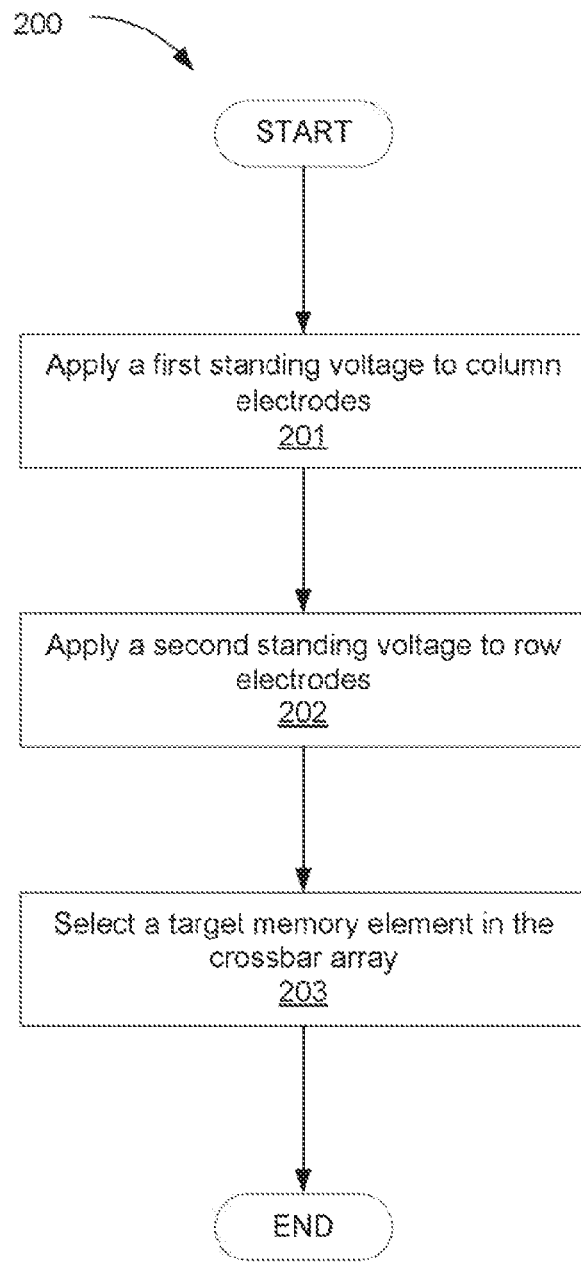
FIG. 2 is a flowchart of a method for asymmetrically selecting a memory element according to one example of the principles described herein.

FIG. 2 is a flowchart of a method (200) for asymmetrically selecting a memory element (FIG. 1, 104) according to one example of the principles described herein. The method (200) may include applying (block 201) a first standing voltage to a number of column electrodes of a crossbar array. The first standing voltage may be a voltage that is less than a switching voltage of the memory elements (FIG. 1, 104) of a memory array (FIG. 1, 102). For example, as described above, a memristor may have a switching voltage that refers to a voltage wherein the memristor switches between resistance states. In this example, the first standing voltage may be a value xV, where V is the switching voltage of the memristor, and x is a value less than ½.

The method (200) also includes applying (block 202) a second standing voltage to a number of row electrodes of a crossbar array. Applying (block 201) a first standing voltage and applying (block 202) a second standing voltage may occur simultaneously. In some examples, the second standing voltage may be a voltage that is less than a switching voltage of the memory element (FIG. 1, 104). For example, the second standing voltage may be a value yV. In this example, V may be the switching voltage of the memristor, and y may be a value greater than 1.2. In some examples the relationship between the first standing voltage and the second standing voltage may be defined by the equation y=1−x. The second standing voltage may be the same polarity relative to the first standing voltage. Applying a second standing voltage that is distinct from the first standing voltage may be beneficial in that it reduces the overall amount of sneak current in the memory array (FIG. 1, 102). More detail concerning the overall sneak current of a memory array (FIG. 1, 102) is given below in connection with FIG. 4.

The method (200) may also include selecting (block 203) a target memory element (FIG. 1, 104) in the memory array (FIG. 1, 102). As described above, a target memory element (FIG. 1, 104) is a memory element (FIG. 1, 104) that is intended to be written to or read from. Selecting (block 203) a target memory element (FIG. 1, 104) may include relaying a first selecting voltage from the controller (FIG. 1, 101) to a column electrode corresponding to the memory element (FIG. 1, 104) and relaying a second selecting voltage from the controller (FIG. 1, 101) to a row electrode corresponding to the memory element (FIG. 1, 104). A selector (FIG. 1, 105) of the memristor cell (FIG. 1, 103) may perform the selection. With both the row and column electrodes receiving a selecting voltage, the target memory element (FIG. 1, 104) is active.

Figure 3:
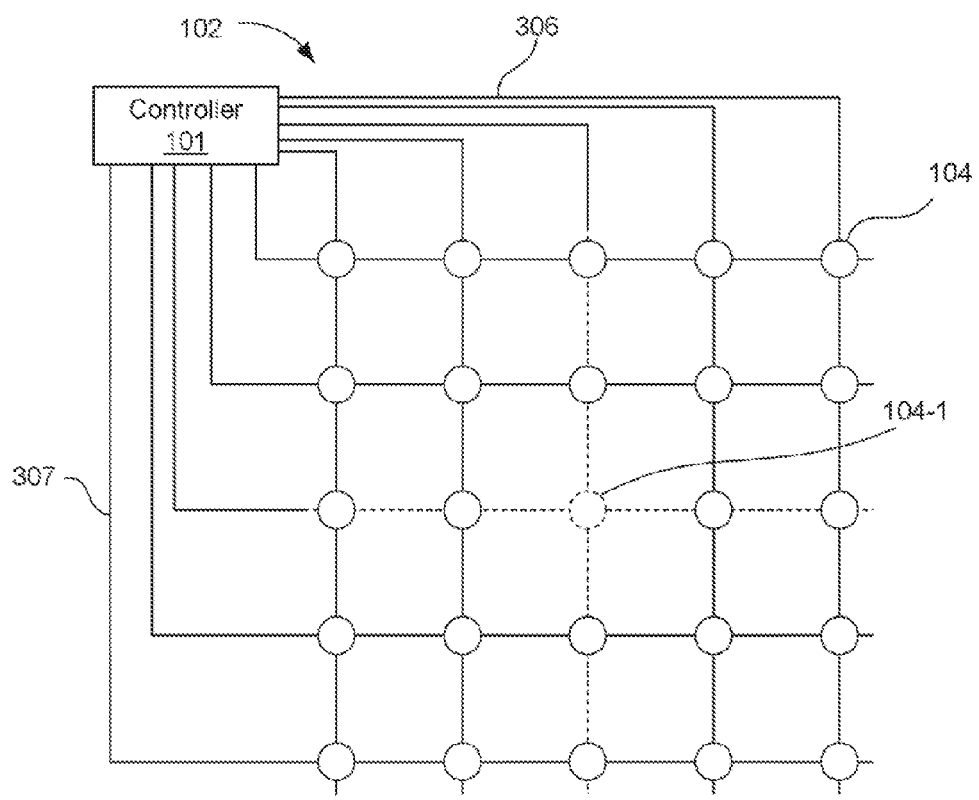
FIG. 3 is a diagram of a memory array with an asymmetrically selected memory element according to one example of the principles described herein.

FIG. 3 is a diagram of a memory array (102) with an asymmetrically selected memory element (104-1) according to one example of the principles described herein. As described above, the memory array (102) may include row electrodes (307) and column electrodes (306) that are perpendicular to one another. For simplicity, FIG. 3 depicts one row electrode (307) and one column electrode (306) with a reference number, but all instances may have similar properties. The intersection of each column electrode (306) and row electrode (307) may define a memory element (104). A memory element (104) combined with a selector (FIG. 1, 105) forms a memory cell (FIG. 1, 103). For simplicity, a few memory elements (104) have been identified with reference numbers, but all memory elements (104) in the memory array (102) may share similar characteristics. One such characteristic is a switching voltage, V, which is defined as the voltage drop across a memory element (FIG. 1, 104) that causes the memory element (FIG. 1, 104) to switch states. To select a target memory element (104-1) indicated in FIG. 3 by a dashed circle, the controller (101) may pass a number of selecting voltages to electrodes (306, 307) that correspond to the target memory element (104). In FIG. 3, the electrodes (306, 307) that correspond to the target memory element (104-1) are indicated by dashed lines. Selectors (FIG. 1, 105-1, 105-2) that correspond to the target memory element (104-1) may relay the selecting voltages to electrically isolate the target memory element (104) from the rest of the memory elements (104) in the memory array (102). In this fashion, the target memory element (104-1) may be written to, or read from.

More specifically, the controller (101) may pass a first selecting voltage to a column electrode (306) that corresponds to the target memory element (104-1), which electrode is indicated in FIG. 3 as a vertical dashed line. Similarly, the controller (101) may pass a second selecting voltage to a row electrode (307) that corresponds to the target memory element (104), which electrode is indicated in FIG. 3 as a horizontal dashed line. In this example, the second selecting voltage may be different than the first selecting voltage. The difference between the second selecting voltage and the first selecting voltage may be greater than a switching voltage of the target memory element (104-1) such that the target memory element (104-1) switches state.

For example, given a switching voltage V, the first selecting voltage may be a value $V_1$ and the second selecting voltage may be a value $V_2$, such that $V_1-V_2$ is at least equal to V. In other words, the voltage drop across the target memory element (104-1) may be at least equal to a switching voltage of the memory element (104-1) and may be realized by a difference between the first selecting voltage, $V_1$ and the second selecting voltage, $V_2$. In a specific example, the first selecting voltage may be V and the second selecting voltage may be ground, or zero. In this fashion, the target memory element (104-1) may be selected and subsequent reads and writes to the target memory element (104-1) may be effectuated.

In some examples, the memory element (104) of the memory cell (FIG. 1, 103) may be asymmetric. More specifically, a negative switching voltage of the memristor may be less than a positive switching voltage of the memristor. An asymmetric memory element may be beneficial by increasing the non-linearity of the memory array (102). The increased non-linearity serves to reduce the overall sneak current passing through the memory array (102) as described below in FIG. 4.

Similarly, in some examples, the selector (FIG. 1, 105) of the memory cell (FIG. 1, 103) may be asymmetric. More specific, a current passing through the selector (FIG. 1, 105) for a negative voltage may be less than a current for a positive voltage having the same absolute value. More detail regarding the asymmetry of the selectors (FIG. 1, 105) and the memory elements (FIG. 1, 104) is given below in connection with FIG. 4.

The controller (101) may also pass a number of standing voltages to a number of other memory elements (104) in the memory array (102); those memory elements (104) that are not the target memory element (104-1), for example. The controller (101) may pass a first standing voltage to a number of column electrodes (306) that do not correspond to the target memory element (104-1) and may pass a second standing voltage to a number of row electrodes (307) that do not correspond to the target memory element (104-1). In some examples, the first standing voltage may be a first voltage, xV, where V is the switching voltage of memory elements (104) in the memory array (102). The second standing voltage may be a second voltage, yV, where V is the switching voltage of the memory elements (104) in the memory array (102). In some examples y may equal 1−x. In other words, asymmetric standing voltages may be passed through a number of electrodes (306, 307) in the memory array (102). Passing such asymmetric standing voltages may be beneficial for a number of reasons as will be described in connection with FIG. 4.

Figure 4:
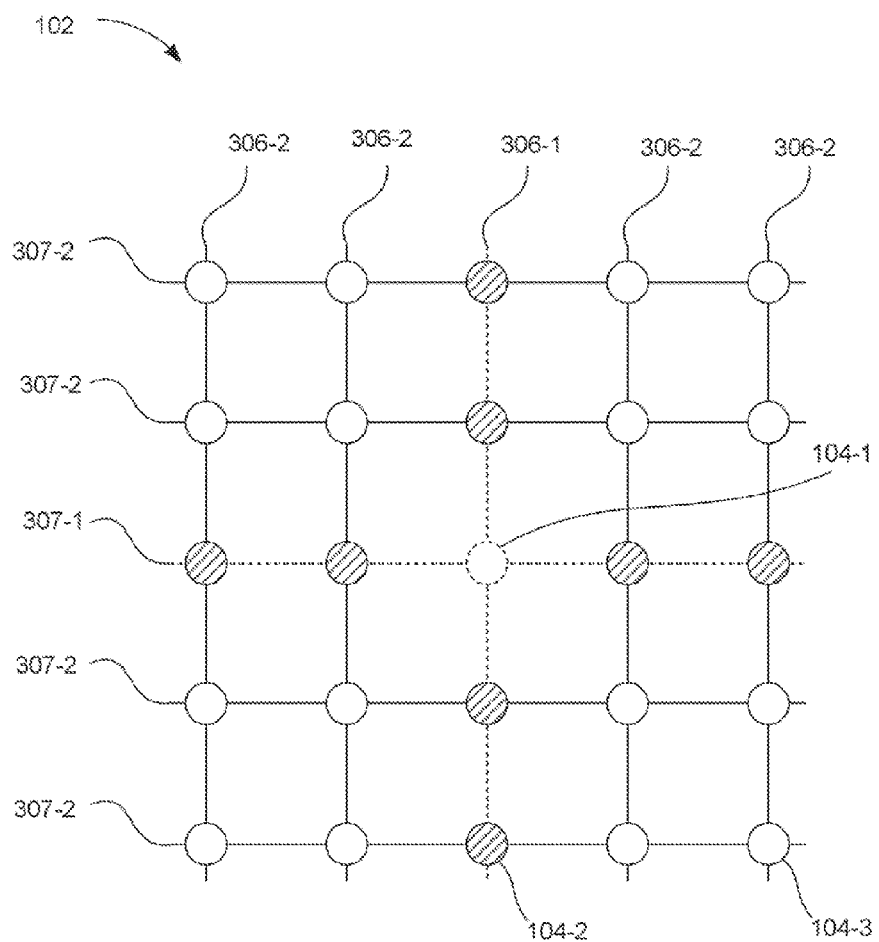
FIG. 4 is another diagram of a memory array with an asymmetrically selected memory element according to one example of the principles described herein.

FIG. 4 is a diagram of a memory array (102) with an asymmetrically selected memory element (104-1) according to one example of the principles described herein. As described above, one column electrode (306) of the column electrodes (306) may be selected to target a memory element (104-1). As used in FIG. 4, the column electrode (306) to select the target memory element (104-1) may be referred to as a selecting column electrode (306-1) and other column electrodes (306) may be referred to as standing column electrodes (306-2). Similarly, one row electrode (307) of the row electrodes (307) may be selected to target a memory element (104-1). As used in FIG. 4, the row electrode to (307) select the target memory element (104-1) may be referred to as a selecting row electrode (307-1) and other row electrodes (307) may be referred to as standing row electrodes (307-2).

The intersection of the selecting column electrode (306-1) and the selecting row electrode (307-1) may result in an activated target memory element (104-1) indicated by a dashed circle. The standing column electrodes (306-2) may receive a first standing voltage. The first standing voltage may be a value xV where V is the switching voltage of the memory elements (104) in the memory array (102) and x is a value less than ½. The first switching voltage may be the same polarity as the selecting voltage applied to the selecting column electrode (306-1). Similarly, the standing row electrodes (307-2) may receive a second standing voltage. The second standing voltage may be a value yV where V is the switching voltage of the memory elements (104) in the memory array (102) and y is a value greater than ½.

In this example, the benefit of the asymmetrically selected memory element (104-1) may be determined by calculating the total sneak current of the memory array (102). In this example, there may be a very small sneak current passing through the target memory element (104-1). Sneak current may be determined based on the voltage that passes through the memory elements (104) that are not selected. A number of memory elements (104) share the selecting column electrode (306-1) or the selecting row electrode (307-1) with the target memory element (104-1), such that these "partially-selected," memory elements (104-2), indicated in FIG. 4 with cross-hatching, receive either the first selecting voltage passed through the selecting column electrode (306-1) or the second selecting voltage passed through the selecting row electrode (307-1). In receiving just one of the selecting voltages, these "partially-selected" memory elements (104-2) may exhibit a voltage drop, but the voltage drop may be less than the switching voltage of the memory elements (104-2) such that the memory elements (104-2) do not switch state. However, the voltage drop across these partially-selected memory elements (104-2) may contribute to sneak current in the memory array (102). For simplicity, one partially-selected memory elements (104-2) is indicated with a reference number, however all partially-selected memory elements (104-2) may share similar characteristics.

The voltage present in the partially-selected memory elements (104-2) may be calculated by determining the difference between the standing voltage and the selecting voltage corresponding to the memory element (104-2). For example, given a first standing voltage of xV, x being less than ½, a switching voltage of V, a first selecting voltage of V, a second selecting voltage of 0, and a second standing voltage of yV, y being greater than ½, the voltage drop across the partially-selected memory elements (104-2) may be calculated by subtracting the voltage along a column electrode (306) from a row electrode (307). For example, memory elements (104-2) that fall along the selecting column electrode (306-1) may have a voltage drop equal to the first selecting voltage V minus the second standing voltage yV for a voltage drop of (1−y)V. Similarly, the memory elements (104-2) that fall along the selecting row electrode (307-1) may have a voltage drop equal to first standing voltage minus, xV, minus the second selecting voltage, 0 for a voltage drop of xV. As both y and x are positive values, this would result in a voltage polarity for the partially-selected memory elements (104-2) that is the same as the polarity of the switching voltage. Note that x and y being less than the switching voltage, V, a voltage drop across the partially-selected memory elements (104-2) is less than the switching voltage for the memristors in the array. While the above example referenced specific values of the different voltages any value may be used for any voltage such that the difference between selecting voltages is at least equal to the switching voltage of the memory element (104-1).

In the memory array (102) a number of memory elements (104) do not share any electrodes with the target memory element (104-1). Such unselected memory elements (104-3) are indicated by solid unfilled circles. For simplicity, one unselected memory element (104-3) is identified with a reference number, however, memory elements (104) indicated by solid and unfilled circles share similar characteristics. Again given a first standing voltage of xV, a switching voltage of V, first selecting voltage of V, a second selecting voltage of 0, and a second standing voltage of yV, the voltage drop across the unselected memory elements (104-3) may equal the first standing voltage, xV, minus the second standing voltage, yV, for a total voltage drop of (x−y)V. In other words, the voltage drop across the unselected memory elements (104-3) may be of an opposite polarity of the voltage drop across the partially-selected memory elements (104-2). Put another way, the number of partially-selected memory element (104-2) may have a first voltage drop in an amount such as xV or (1−y)V that is the same polarity as a switching voltage, V, of the target memory element (104-1), and the unselected memory elements (104-3) of the memory array (102) may have a second voltage drop in an amount, such as (x−y)V, which is less than the first voltage drop and is an opposite polarity of the first voltage drop.

As described above, in some examples, the selectors (FIG. 1, 105) may be asymmetric being more greatly non-linear in a positive direction. In other words, an asymmetric selector (FIG. 1, 105) of a memory cell (FIG. 1, 103) may have more current for a positive value voltage as compared to the current for a similar negative value voltage of the same magnitude. Thus, as the memory array (102) has a number of memory cells (FIG. 1, 103) with negative voltage values, i.e., those corresponding to the unselected memory elements (104-3), the current passing through those cells will be smaller and will therefore result in a memristor array (102) with a smaller overall sneak, current. Moreover, that the unselected memory elements (104-3) have a negative voltage drop offsets the positive voltage drop of the partially selected memory element (104-2). The sneak current of the memristor array (102) may be calculated by the following equation:

$$I_{sneak} = (2 \times (n-1) \times I_{xV}) + ((n-1)^2) \times I_{(2x-1)V}$$ (Formula 1)

In Formula 1, $I_{sneak}$ refers to the sneak current, and $I_{xV}$ refers to the current passing through a partially selected memory element (104-2), $I_{(2x-1)V}$ refers to the current passing through an unselected memory element (104-3), and n refers to the number of column electrodes (306) and row electrodes (307) in the memory array (102).

Methods and systems for asymmetrically selecting a memory cell (FIG. 1, 103) may have a number of advantages, including: (1) improving memory array (FIG. 1, 102) lifetime; (2) reducing current sneak paths in the memory array (FIG. 102); (3) increasing the array (FIG. 1, 102) storage capacity (FIG. 1, 102); (3) improving reliability of the memristor array (FIG. 1, 102); (4) improve consistency of read and write times; and (5) constrain worst case power consumption.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processing resources (508) or other programmable data processing apparatus, implement the functions or acts specified in the flowchart and/or block diagram block or blocks. In one example, the computer usable program code may be embodied within a computer readable storage medium; the computer readable storage medium being part, of the computer program product. In one example, the computer readable storage medium is a non-transitory computer readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A system for asymmetrically selecting a memory element, comprising:
   a number of memory cells in a crossbar array, each memory cell comprising:
      a memory element to store information, the memory element being defined as an intersection between a column electrode and a row electrode of the crossbar array; and
      a selector to select a target memory element by:
         relaying a first selecting voltage to a column electrode that corresponds to the target memory element; and
         relaying a second selecting voltage to a row electrode that corresponds to the target memory element; and
   a controller to:
      pass a first standing voltage to column electrodes of the crossbar array; and
      pass a second standing voltage to row electrodes of the crossbar array; in which the first standing voltage is different than from the second standing voltage.

2. The system of claim 1, in which the row electrodes are perpendicular to the column electrodes.

3. The system of claim 1, in which the memory element is a memristor.

4. The system of claim 3, in which the memristor is asymmetric.

5. The system of claim 4, in which a negative switching voltage of the memristor is less than a positive switching voltage of the memristor.

6. The system of claim 1, in which the selector is an asymmetric selector.

7. The system of claim 6, in which a current for a negative voltage is less than a current for a positive voltage of the same absolute value.

8. The system of claim 1, in which:
   a number of partially-selected memory elements of the crossbar array have a first voltage drop in a first amount; and
   a number of unselected memory elements of the crossbar array have a second voltage drop in a second amount that is less than the first amount and of an opposite polarity of the first voltage drop.

9. A method for asymmetrically selecting a memory element, comprising, with a controller:
   applying a first standing voltage to column electrodes of a crossbar array;
   applying a second standing voltage to row electrodes of the crossbar array, in which the second standing voltage is different than the first standing voltage;
   selecting a target memory element in the crossbar array by:
      relaying a first selecting voltage to a column electrode corresponding to the target memory element; and
      relaying a second selecting voltage to a row electrode corresponding to the target memory element.

10. The method of claim 9, in which the memory element is a memristor.

11. The method of claim 9, in which:
   a voltage drop across a target memory element is at least equal to a switching voltage of the memory element; and
   the voltage drop is realized by a difference between the first selecting voltage and the second selecting voltage.

12. The method of claim 9, in which:
   the first standing voltage is a first value, xV; and
   the second standing voltage is a value, yV, in which V is a switching voltage of the target memory element.

13. A system for asymmetrically selecting a memory element, comprising:
   a number of memristor cells in a crossbar array, each memristor cell comprising:
      a memristor to store information;
      a controller to:
         apply a first standing voltage, xV, to a number of column electrodes of the crossbar array;
         apply a second standing voltage, yV, to a number of row electrodes of the crossbar array; and
      a selector to select a target memristor by:
         relaying a number of selecting voltages to a column electrode and row electrode that correspond to the target memristor, such that the difference between the selecting voltages is at least equal to the switching voltage, V, of the memristor.

14. The system of claim 13, in which x is less than ½.
15. The system of claim 13, in which y is more than ½.

* * * * *